(12) United States Patent
Harvey et al.

(10) Patent No.: US 12,196,167 B2
(45) Date of Patent: *Jan. 14, 2025

(54) BATTERY PACK FOR POWER EQUIPMENT

(71) Applicant: BRIGGS & STRATTON, LLC, Wauwatosa, WI (US)

(72) Inventors: Kyle Michael Harvey, Wauwatosa, WI (US); Bryan Keith Dandridge, Waukesha, WI (US)

(73) Assignee: Briggs & Stratton, LLC, Wauwatosa, WI (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/508,157

(22) Filed: Nov. 13, 2023

(65) Prior Publication Data

US 2024/0077053 A1 Mar. 7, 2024

Related U.S. Application Data

(63) Continuation of application No. 17/863,976, filed on Jul. 13, 2022, now Pat. No. 11,815,058, which is a
(Continued)

(51) Int. Cl.
| | |
|---|---|
| *H04W 4/00* | (2018.01) |
| *F02N 11/08* | (2006.01) |
| *G06F 3/147* | (2006.01) |
| *H01M 10/42* | (2006.01) |
| *H01M 50/204* | (2021.01) |
| *H01M 50/251* | (2021.01) |
| *H01M 50/284* | (2021.01) |

(Continued)

(52) U.S. Cl.
CPC ...... *F02N 11/0803* (2013.01); *F02N 11/0862* (2013.01); *G06F 3/147* (2013.01); *H01M 10/425* (2013.01); *H01M 50/204* (2021.01); *H01M 50/251* (2021.01); *H01M 50/284* (2021.01); *H04W 4/00* (2013.01); *H04W 4/48* (2018.02); *H05K 1/181* (2013.01); *H05K 5/0069* (2013.01); *F02N 2300/306* (2013.01); *H01M 2220/20* (2013.01); *H04W 4/80* (2018.02)

(58) Field of Classification Search
CPC ............ F02N 11/0803; F02N 11/0862; F02N 2300/306; H04W 4/48; H04W 4/00; H04W 4/80; H01M 50/251; H01M 50/204; H01M 50/284; H01M 10/425; H01M 2220/20; G06F 3/147; H05K 1/181; H05K 5/0069
See application file for complete search history.

(56) References Cited

U.S. PATENT DOCUMENTS

| | | |
|---|---|---|
| 9,127,658 B2 | 9/2015 | Koenen et al. |
| 9,624,891 B2 | 4/2017 | Koenen et al. |

(Continued)

*Primary Examiner* — Adolf D Berhane
(74) *Attorney, Agent, or Firm* — Foley & Lardner LLP

(57) ABSTRACT

A battery pack is configured to be coupled to outdoor power equipment and includes a battery positioned in a housing, the housing comprising an interface surface, a plurality of high current pins electrically connected to the battery and accessible through the interface surface, a plurality of low current pins electrically connected to the battery and accessible through the interface surface, and a battery controller electrically coupled to the battery, the plurality of low current pins, and the plurality of high current pins.

20 Claims, 15 Drawing Sheets

Related U.S. Application Data continuation of application No. 17/323,395, filed on May 18, 2021, now Pat. No. 11,401,902, which is a continuation of application No. 16/913,918, filed on Jun. 26, 2020, now Pat. No. 11,105,308, which is a continuation of application No. 16/529,165, filed on Aug. 1, 2019, now Pat. No. 10,711,755, which is a continuation of application No. 15/869,610, filed on Jan. 12, 2018, now Pat. No. 10,400,732.

(60) Provisional application No. 62/445,838, filed on Jan. 13, 2017.

(51) Int. Cl.
*H04W 4/48* (2018.01)
*H05K 1/18* (2006.01)
*H05K 5/00* (2006.01)
*H04W 4/80* (2018.01)

(56) References Cited

U.S. PATENT DOCUMENTS

| | | | |
|---|---|---|---|
| 9,726,135 | B2 | 8/2017 | Zeiler et al. |
| 10,400,732 | B2 | 9/2019 | Harvey et al. |
| 10,711,755 | B2 | 7/2020 | Harvey et al. |
| 11,053,906 | B2 | 7/2021 | Koenen et al. |
| 11,105,308 | B2 | 8/2021 | Harvey et al. |
| 11,111,896 | B2 | 9/2021 | Koenen et al. |
| 11,401,902 | B2 | 8/2022 | Harvey et al. |
| 11,815,058 | B2 * | 11/2023 | Harvey ............... H05K 5/0069 |
| 2014/0299089 | A1 | 10/2014 | Koenen et al. |
| 2015/0240773 | A1 | 8/2015 | Koenen et al. |
| 2015/0240774 | A1 | 8/2015 | Zeiler et al. |
| 2016/0115933 | A1 | 4/2016 | Koenen et al. |
| 2016/0233694 | A1 | 8/2016 | Koenen et al. |

\* cited by examiner

BATTERY PACK FOR POWER EQUIPMENT

CROSS-REFERENCE TO RELATED PATENT APPLICATIONS

This application is a Continuation of U.S. patent application Ser. No. 17/863,976, filed on Jul. 13, 2022, which is a Continuation of U.S. patent application Ser. No. 17/323,395, filed May 18, 2021, which is a Continuation of U.S. patent application Ser. No. 16/913,918, filed Jun. 26, 2020, which is a Continuation of U.S. patent application Ser. No. 16/529,165, filed Aug. 1, 2019, which is a Continuation of U.S. patent application Ser. No. 15/869,610, filed Jan. 12, 2018, which claims priority to U.S. Provisional Patent Application Ser. No. 62/445,838, filed Jan. 13, 2017, the disclosures of which are all incorporated herein by reference in their entireties.

BACKGROUND

The present disclosure generally relates to an electric starter battery for use with internal combustion engines. More specifically, the present disclosure relates to an electric starter battery and mounting and positioning arrangements to provide the required electric power to operate a starter motor for use in starting internal combustion engines, such as used in large lawn equipment, including riding lawn tractors and zero turn radius (ZTR) mowers.

ZTR mowers and lawn tractors are two types of popular lawn mowing equipment that include an internal combustion engine that provides power for both moving the mower/tractor and rotating one or more mowing blades during use. Each type of mower includes an internal combustion engine that is started utilizing an electric starter motor. The electric starter motor is typically powered by a lead acid battery, which must be mounted somewhere on the mower/tractor. Lead acid batteries have proven effective in powering a starter motor for an internal combustion engine. However, lead acid batteries are costly, heavy and subject to maintenance and charging demands.

The present disclosure provides an improved electric starter battery and receiving receptacle for driving the starter motor of an internal combustion engine. The improved electric starter battery provides enhanced communications and operation while reducing the size and weight of the electric starter battery as compared to a lead acid battery.

SUMMARY OF THE INVENTION

The present disclosure relates to the field of indoor and outdoor power equipment, and in particular to the field of battery powered indoor and outdoor power equipment.

One embodiment relates to a battery pack configured to be coupled to outdoor power equipment. The battery pack includes a battery positioned in a housing. The housing includes an interface surface. The battery pack also includes a plurality of high current pins electrically connected to the battery and accessible through the interface surface, a plurality of low current pins electrically connected to the battery and accessible through the interface surface, and a battery controller electrically coupled to the battery, the plurality of low current pins, and the plurality of high current pins.

Another embodiment relates to outdoor power equipment including an internal combustion engine, a starter motor configured to start the internal combustion engine, a battery pack configured to supply power to the starter motor, and a mounting bracket configured to mount a smart device. The battery pack is configured to wirelessly communicatively couple to the smart device.

Various other features, objects and advantages of the invention will be made apparent from the following description taken together with the drawings.

BRIEF DESCRIPTION OF THE DRAWINGS

The drawings illustrate the best mode presently contemplated of carrying out the disclosure. In the drawings.

DETAILED DESCRIPTION

Figure 1:
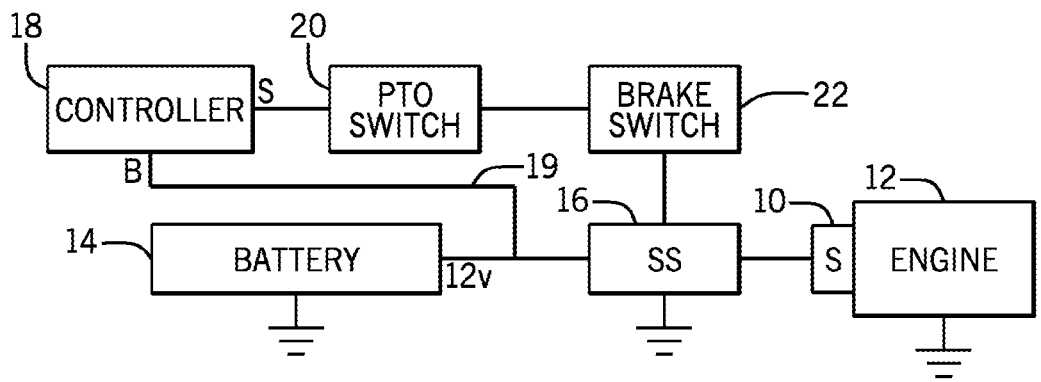
FIG. 1 is an electrical schematic illustration of a prior art starting circuit utilizing a lead acid battery.

FIG. 1 illustrates the electrical connections used for providing starting power for the electric starter motor 10 of an internal combustion engine 12 according to prior art systems. The prior art system shown includes a twelve volt lead acid battery 14 that is connected to a starter solenoid 16. An engine controller 17 is used to control the position of the starter solenoid 16 to selectively apply the stored battery power/current to the starter motor 10. The controller 18 communicates control commands to the starter solenoid 16 through the control line 19. In the system shown in FIG. 1, a PTO switch 20 and brake switch 22 are connected in series and provide signals to the controller 18 such that the controller selectively supplies battery power to the starter motor 10 only upon the PTO switch 20 and brake 22 being in the desired position. Alternatively, the PTO switch 20 and brake switch 22 can be connected directly to the starter solenoid 16 such that the starter solenoid 16 can be moved to supply battery power to the starter motor 10 only when the PTO switch 20 and brake switch 22 are in the desired position. The configuration shown in FIG. 1 is a common, well known configuration for powering the starter motor 10 from a lead acid battery 14.

Figure 2:
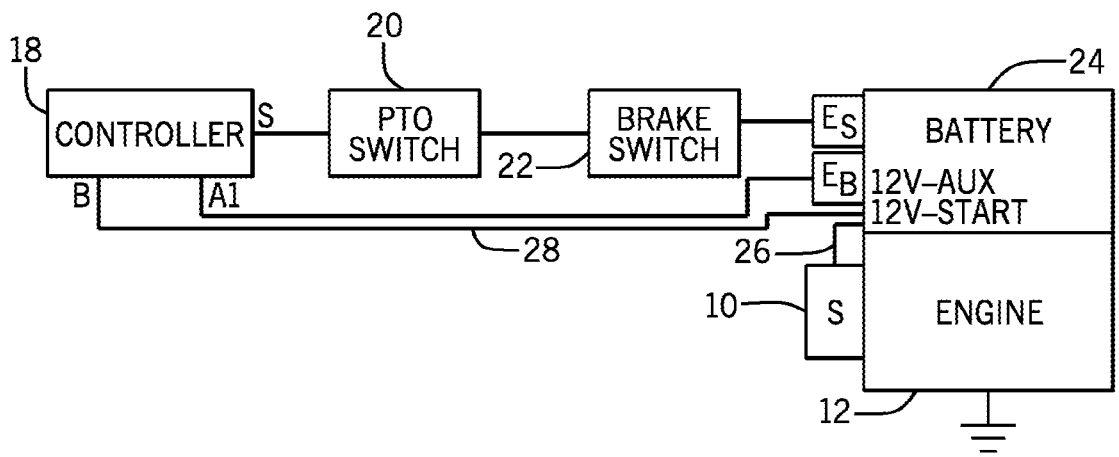
FIG. 2 is an electrical schematic illustration of a first embodiment of the engine mounted electric starter battery of the present disclosure.

FIG. 2 illustrates a first embodiment of the electric starter battery 24 and system configuration constructed in accordance with the present disclosure. The electric starter battery 24 is no longer a lead acid battery and instead is a battery pack preferably including a series of lithium ion cells that are connected to each other to provide the required electric power to both operate the starter motor 10 and provide auxiliary power to auxiliary electrical components on the mower, such as the lights, radio, display, etc. The electric starter battery 24 includes a twelve-volt starting output line 26 that is connected directly to the starter motor 10. A twelve-volt auxiliary output 28 is connected to the controller 18, which in turn can selectively provide auxiliary power to components on the mower for powering the components when the internal combustion engine is not operating. In the embodiment shown in FIG. 2, the electric starter battery 24 is mounted directly to the internal combustion engine 12 in a manner that will be described in much greater detail below.

Figure 3:
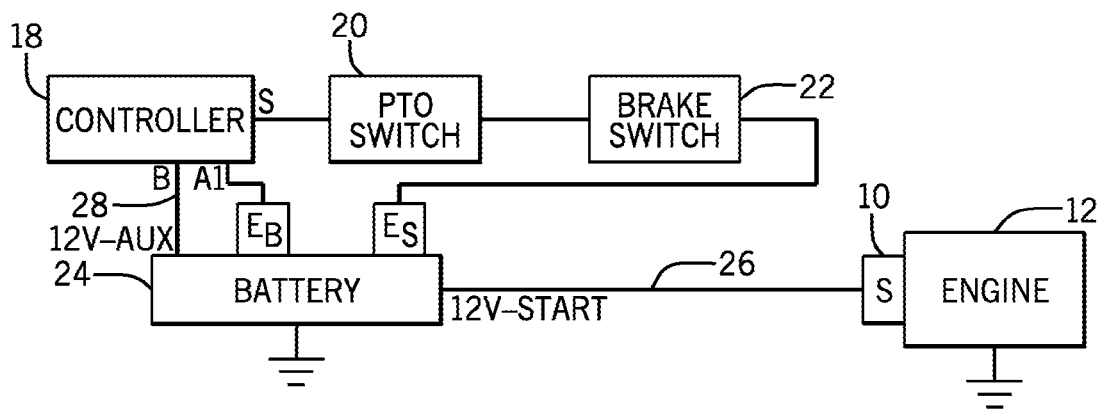
FIG. 3 is a second embodiment of the electric starter battery mounted remotely from the internal combustion engine.

FIG. 3 illustrates another alternate embodiment of the present disclosure that is functionally equivalent to the embodiment of FIG. 2 but in which the electric starter battery 24 is mounted at a location remote from the engine 12. The electric starter battery 24 is connected to the starter motor 10 and a controller 18 in a similar manner as shown in FIG. 2. The electric starter battery 24 in FIG. 3 is also a lithium ion battery that includes an output line 26 dedicated solely to the starter motor 10 and a second output 28 that is dedicated to auxiliary features or devices on the tractor/mower and is controlled by the controller 18.

Figure 4:
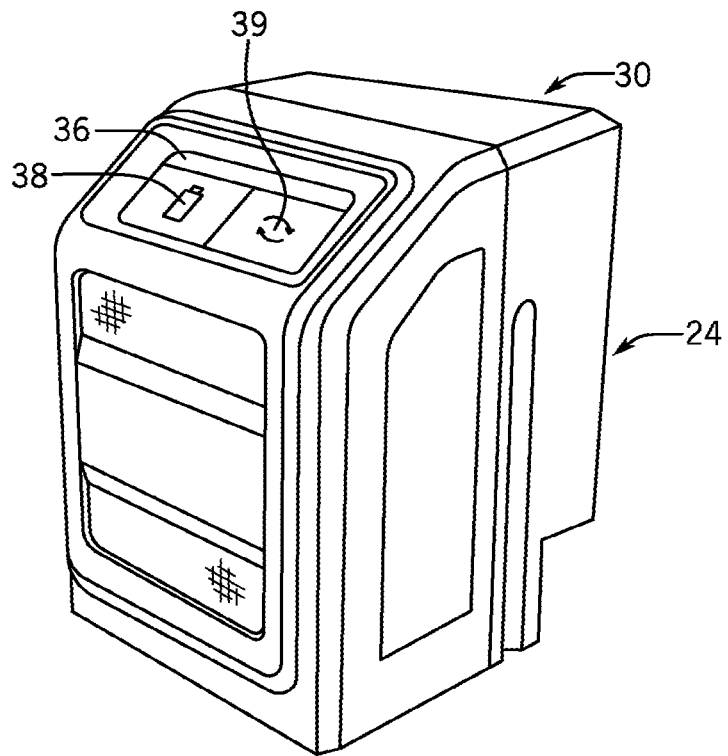
FIG. 4 is a front perspective view of the electric starter battery according to some embodiments of the present disclosure.
Figures 5, 6:
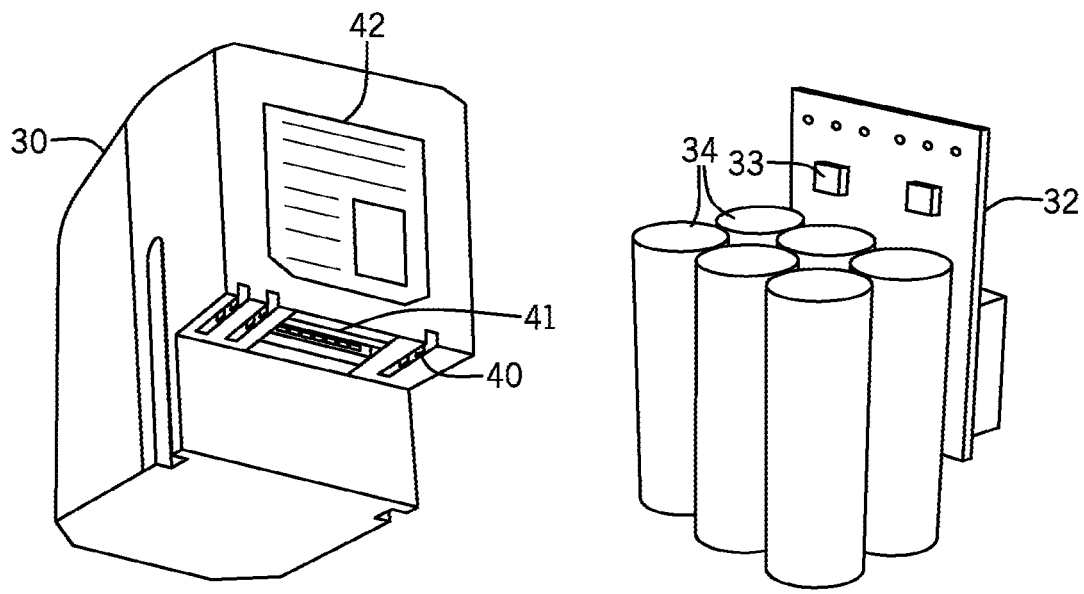
FIG. 5 is a back view of the electric starter battery according to some embodiments.
FIG. 6 is a perspective view of the circuit board and battery cells according to some embodiments.

FIG. 4 illustrates a first embodiment of the electric starter battery 24 constructed in accordance with one embodiment of the present disclosure. Although one embodiment of the electric starter battery 24 is shown in FIG. 4, it should be understood that various other physical configurations for the electric starter battery 24 could be utilized while operating within the scope of the present disclosure. In the embodiment shown in FIG. 4, the electric starter battery 24 includes a molded plastic outer housing 30 that surrounds the remaining components of the starter battery 24. The outer housing 30 is sized to receive and contain a printed circuit board 32 and a series of lithium ion battery cells 34, which are shown in FIG. 6. The printed circuit board 32 includes at least a controller 33 that is able to monitor the state of charge on the battery cells 34. The controller 33 can be programmed to receive additional information related to the operation of the lawn tractor/mower and relay this information using wireless communication to a wireless device of the user in the manner to be described below.

In the embodiment of FIG. 6, the electric starter battery includes six lithium ion battery cells 34 that are connected to each other in series. However, a different number of cells and a different type of connection between the individual cells could be utilized depending upon the requirements of the starter motor. Six battery cells 34 have been found to be sufficient to power the starter motor and the auxiliary devices for most outdoor power equipment, including lawn tractors and ZTR mowers.

Referring back to FIG. 4, the outer housing 30 includes a display 36 that can provide information from the battery controller to a user, which at a minimum will include the charging status of the battery cells. In the embodiment shown in FIG. 4, the front face of the battery housing 30 includes a battery check button 38 and a wireless sync button 39. Although two buttons are shown in the embodiment of FIG. 4, it should be understood that only one or more than two buttons could be included on the front face of the outer housing 30. When the battery check button 38 is depressed, the battery controller contained within the housing 30 determines the state of charge of the battery cells 34 and displays this status to the user. The wireless sync button 39 can be depressed by the user to initiate a pairing process with an external communication device, such as a smartphone, as will be described in much greater detail below.

FIG. 5 illustrates a back view of the battery housing 30. As shown in the back view, the outer housing 30 includes a horizontal interface surface 40 that includes a series of high voltage and low voltage connection pins, the configuration of which will be described in much greater detail below with reference to FIG. 9. The low voltage connection pins are contained within the center opening 41 while the high voltage connection pins are each in separate connections slots formed in the outer housing 30. In addition to the interface surface 40, the housing 30 includes a back face section 42 that is positioned adjacent to the circuit board 32 when the circuit board 32 is positioned within the battery housing 30.

Figure 7:
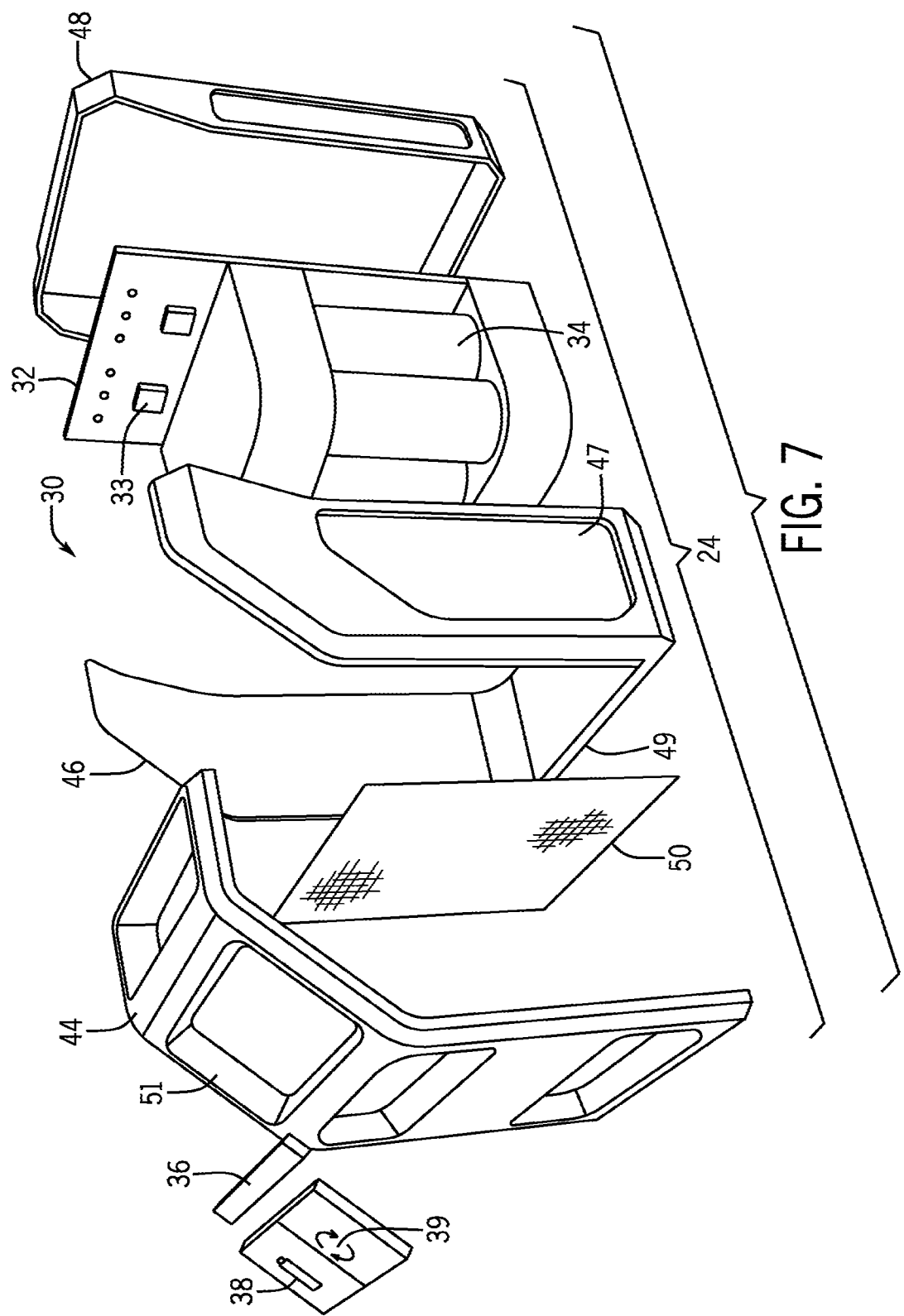
FIG. 7 is an exploded view of the electric starter battery according to some embodiments.
Figure 8:
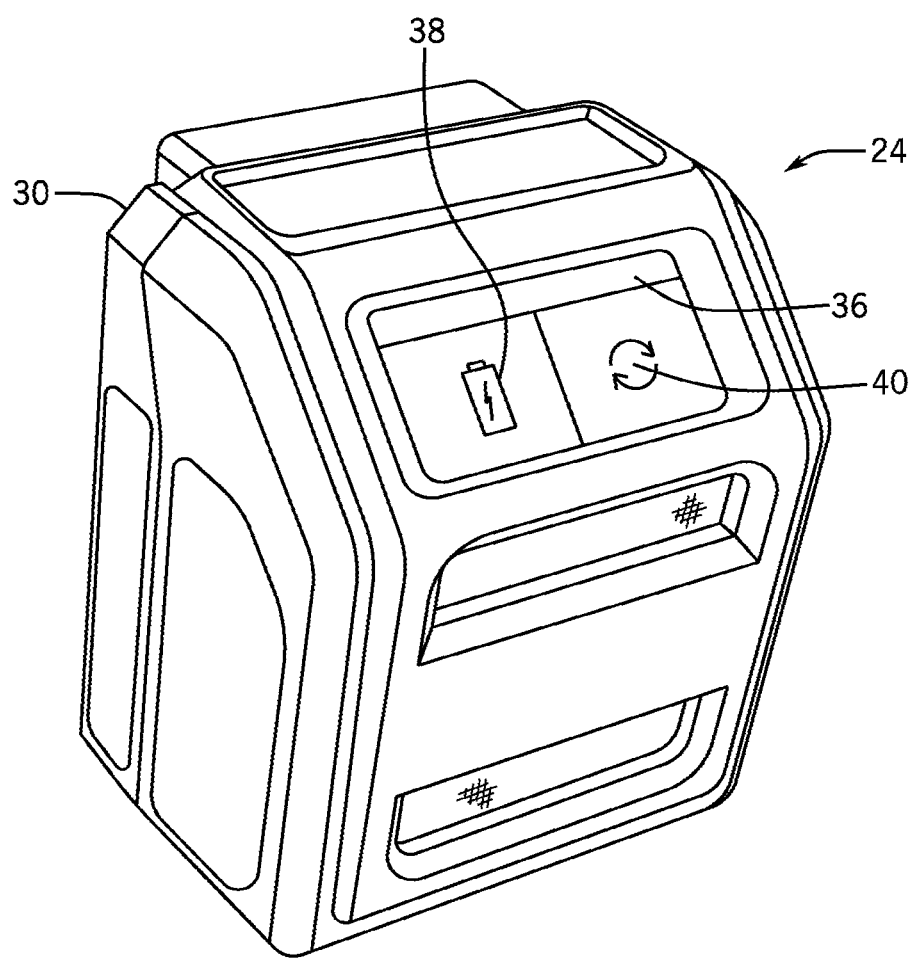
FIG. 8 is a front perspective view showing the front display of the electric starter battery according to some embodiments.

FIG. 7 is an exploded view of the detailed components that combine to form the electric starter battery 24. The outer housing 30 includes a front face plate 44 that is received on the base portion 46. The base portion 46 defines a pair of space side walls 47 connected by a bottom wall 49. The base portion 46 receives the back portion 48 to generally define an open interior of the outer housing. Each of the base portion 46, back portion 48 and front face plate 44 are preferably formed from a molded plastic material and are assembled together in a known manner. The combination of the face plate 44, base portion 46 and back portion 48 surround the circuit board 32 and series of battery cells 34. A mesh covering 50 is positioned between the face plate 44 and the battery cells 34 to allow airflow out of and into the enclosed housing 30 to cool the individual battery cells 34. The battery check button 38 and a wireless sync button 39 are each supported on an angled front face section 51 of the face plate 44 to provide a stable mounting platform for the user to depress either of the two buttons. The display 36 is also mounted to the front face section 51 for viewing by the user when the battery 24 is received on the outdoor power equipment. FIG. 8 is an assembled view of the electric starter battery 24 shown in FIG. 7 and constructed in accordance with one embodiment of the present disclosure.

Figure 9:
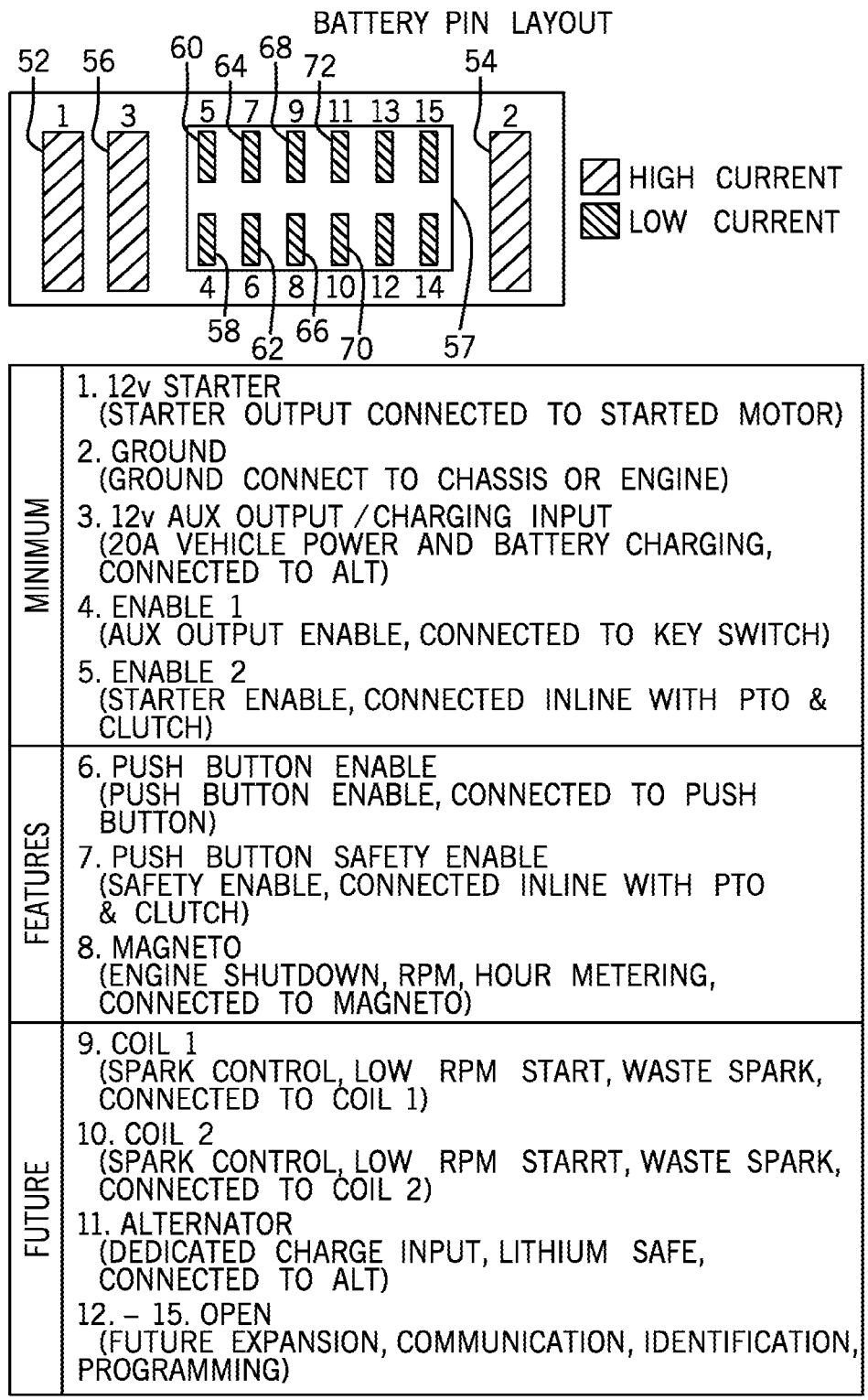
FIG. 9 is a schematic illustration of the battery pin layout of one embodiment of the present disclosure according to some embodiments.

FIG. 9 provides a graphic illustration and brief summary of the pin layout that is accessible through the interface surface 40 shown in FIG. 5. In the embodiment shown, the battery pin layout includes three high current pins and twelve low current pins. The high current pins are used to supply electric power from the battery while the low current pins are used to relay information from the battery controller and receive information signals that are relayed to the battery controller from other components on the lawn tractor/ZTR mower. The information is typically related either to the battery operation or operation of the outdoor power equipment. The high current pins are separated and shielded from the low current pins and from each other. Although one configuration in shown, it should be understood that a different number of pins could be utilized while operating within the scope of the present disclosure.

In the embodiment shown in FIG. 9, pin 52 is a twelve-volt high current starter pin that is connected to the starter motor, such as through the line 26 shown in FIG. 2. The controller 18 shown in FIG. 2 selectively applies the voltage and current from the high current pin 52 to the starter motor 10 when desired to start the internal combustion engine 12. High current pin 54 is a conventional ground pin that is connected to the chassis or the engine. The final high current pin is a twelve-volt auxiliary output/charging input pin 56. The twelve-volt auxiliary output/charging input pin 56 is connected to the alternator such that the alternator can recharge the electric starter battery during operation of the internal combustion engine. When the internal combustion engine is not operating, pin 56 provides twenty amp auxiliary power to the electric components on the tractor/mower, such as headlights, a radio or other electrical components.

The battery pack includes a series of low current pins that are grouped in the low current interface area 57. The first low current pin is an enable pin 58 that is connected to the key switch of the outdoor power equipment. Through this enable pin 58, the battery controller located within the electric starter battery 24 can determine whether the key switch is in the auxiliary position. When in this position, the battery 24 will supply electric power to the auxiliary devices when the internal combustion engine is not running. During operation, electric power is supply to these auxiliary devices from the alternator.

The next pin is the starter enable pin 60 that is connected in line with the PTO and clutch. The starter enable pin 60 is inline with the PTO and clutch and receives an input from the key switch to enable starting of the internal combustion engine. Pins 62, 64 and 66 are additional elective pins that can be used to carry out advanced features as set forth in FIG. 9. Pin 62 can be connected to a push-to-start button if the outdoor power equipment includes a push-to-start button. Pin 64 is a safety enable pin that is connected inline with the PTO and clutch. Pin 66 receives information from the magneto, which allows the controller contained within the electric starter battery to monitor RPMs, operational time of the engine and perform engine shutdown.

The pin layout shown in FIG. 9 includes three additional pins 68, 70 and 72. Pins 68 and 70 are connected to the two coils of the engine to aid in low RPM starting, spark control and for creating waste sparks. Pin 72 is a dedicated charging input pin that can be connected to the alternator and is safe for charging lithium ion batteries. The remaining pins shown in FIG. 9 can be used for additional enhancements in the future, including enhanced communication, identification of the battery and programming.

Figure 10:
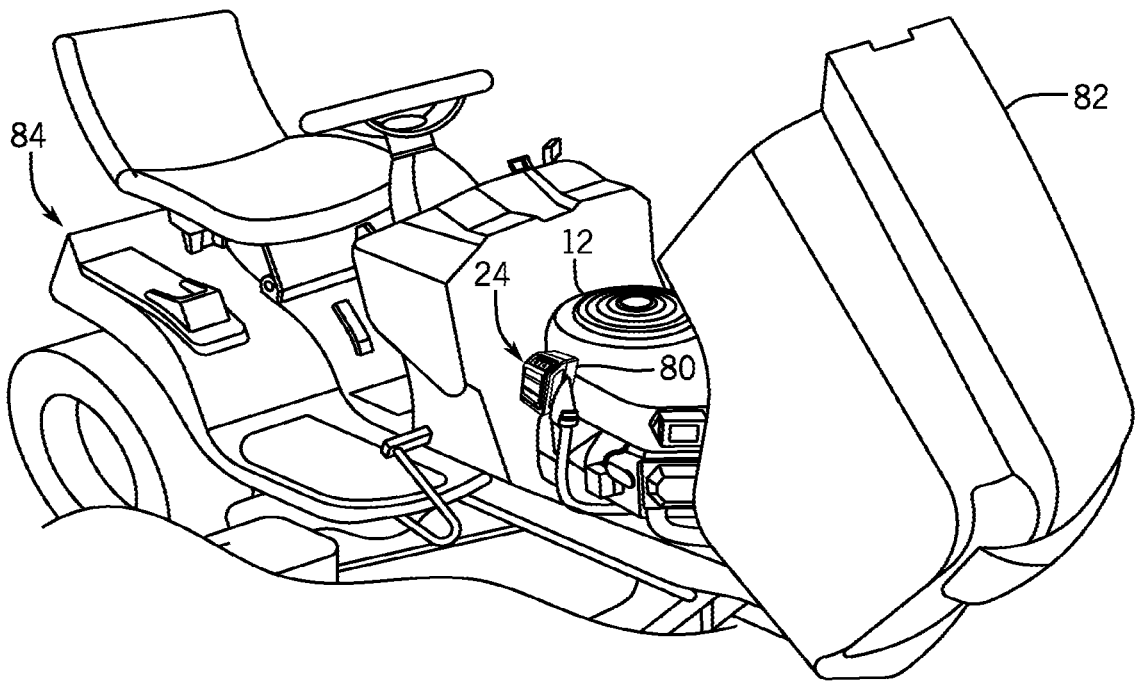
FIG. 10 is a perspective view showing the position of the electric starter battery in a lawn tractor according to some embodiments.

FIG. 10 illustrates a first possible application for the electric starter battery 24. In the embodiment shown, the electric starter battery 24 is received within a receptacle 80 that is mounted to the internal combustion engine 12 of a lawn tractor 84 near the starter motor. The mounting of the receptacle 80 to the engine creates very close positioning between the starter battery 24 and the starter motor. Such location will reduce the amount of copper wiring needed between the starter battery and the starter motor, thereby reducing both material costs and assembly costs. When mounted in this location, the electric starter battery 24 will be concealed beneath the hood 82 of the tractor 84 during operation of the tractor. The position shown in FIG. 10 places the battery 24 under the plenum, which directs outside air onto the engine and will thus cool the starter battery 24.

Figure 11:
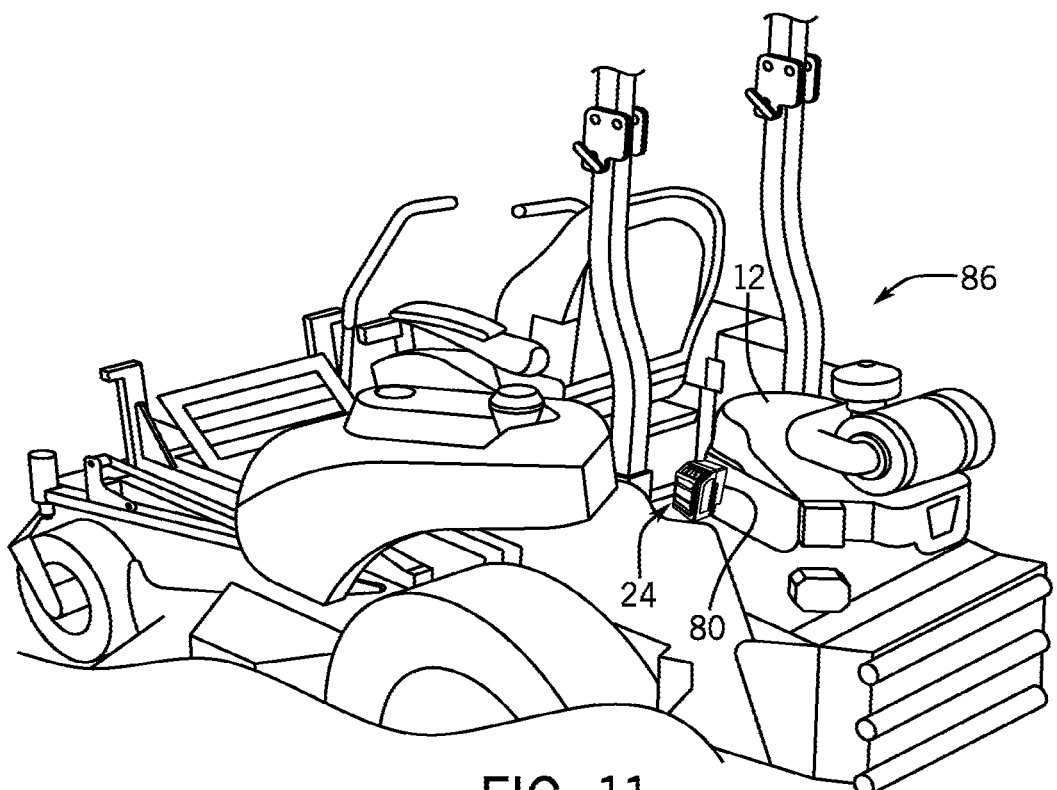
FIG. 11 is a perspective view showing the position of the electric starter battery on a ZTR mower according to some embodiments.

FIG. 11 illustrates the same electric starter battery 24 mounted to the internal combustion engine 12 of a ZTR mower 86. The electric starter battery 24 includes the similar receptacle 80 and the combination of the receptacle and electric starter battery are located near the starter motor of the ZTR mower 86. In this embodiment, the electric starter battery 24 will be viewable to the user during operation, which may be beneficial to monitor the state of charge on the starter batter 24.

Figure 12:
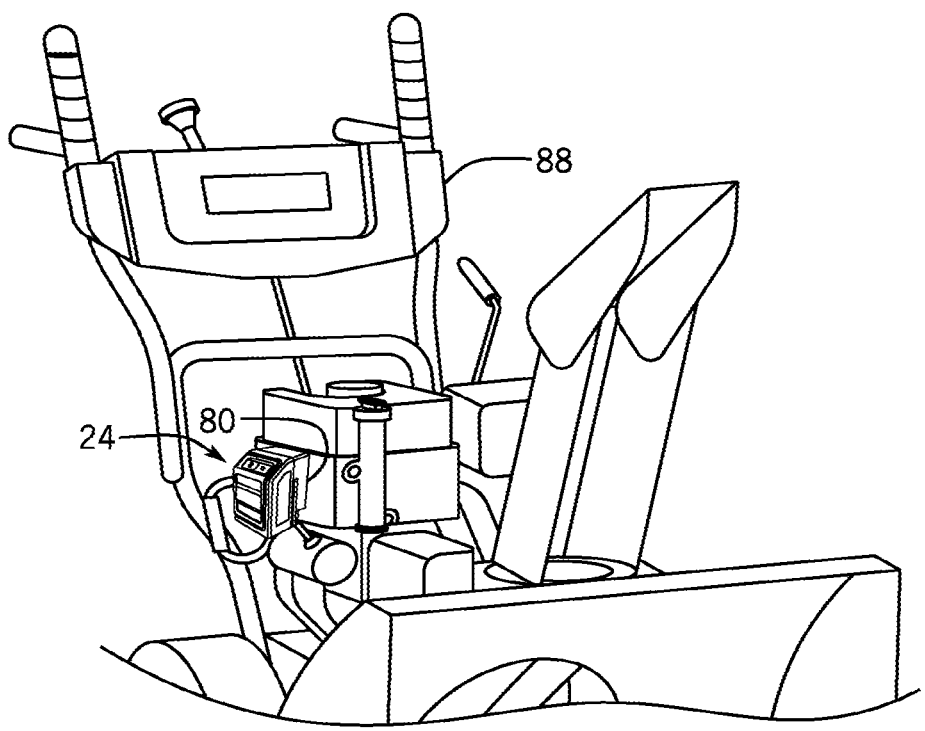
FIG. 12 is a perspective view showing the position of the electric starter battery on a snowthrower according to some embodiments.

FIG. 12 illustrates the electric starter battery 24 mounted to another type of outdoor power equipment, namely a snowthrower 88. In the embodiment shown, the starter battery 24 is mounted to the engine of the snowthrower 88 utilizing the same receptacle 80 described in FIGS. 10 and 11. The receptacle 80 is located near and electrically connected to the starter motor of the snowthrower 88 and in a location where the starter battery 24 can be viewed and easily accessed.

Figure 13:
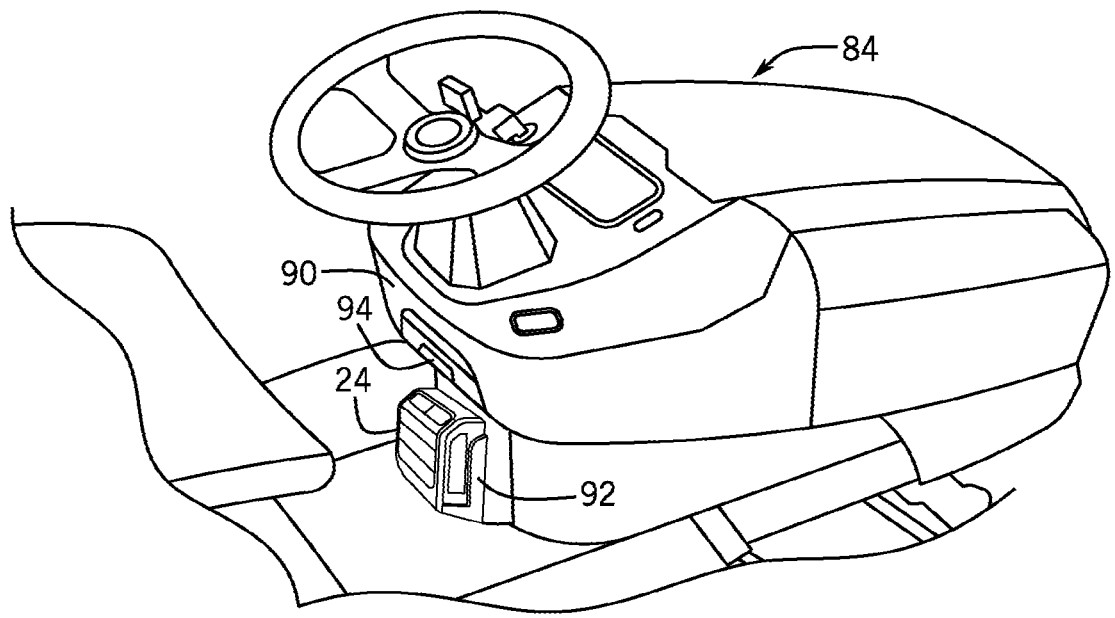
FIG. 13 is a perspective view showing the electric starter battery beneath the steering column of a lawn tractor according to some embodiments.

FIG. 13 illustrates the electric starter battery 24 mounted beneath the steering column 90 of the lawn tractor 84. In the embodiment shown in FIG. 13, the receptacle 92 is slightly modified from the past embodiments. The receptacle 92 performs the same functions as the receptacles described previously, namely providing a secure receiving location and connecting the starter battery 24 to the starter motor. A release button 94 allows for the easy removal of the electric storage battery 24 for charging or other replacement.

Figure 14:
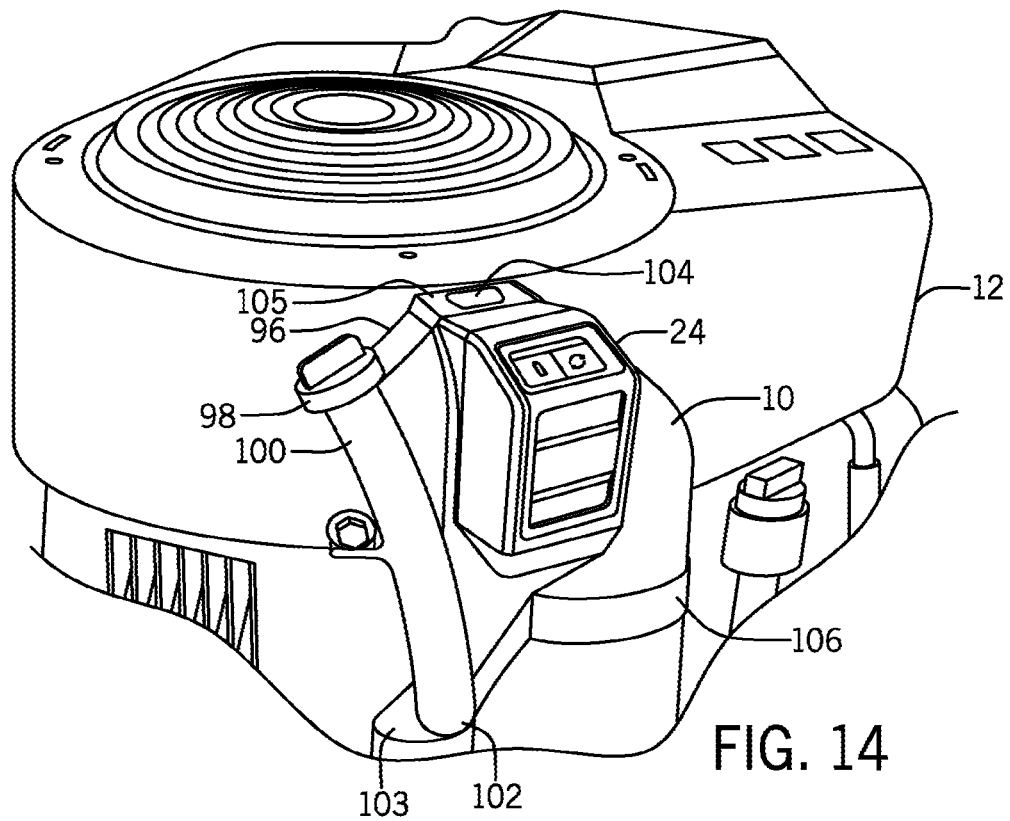
FIG. 14 is a perspective view showing the electric starter battery mounted within a housing that incorporates the oil dipstick according to some embodiments.

FIG. 14 illustrates yet another contemplated mounting arrangement for the electric starter battery 24 on the internal combustion engine 12. In the embodiment shown, the receptacle 96 is designed to integrate with and receive the oil dipstick 98. The receptacle 96 is modified from the past embodiments to include a dipstick receiving tube 100 that includes a lower end 102 received on the conventional access opening 103 on the internal combustion engine. The access opening 103 provides access to an oil sump of the internal combustion engine in a known manner. The dipstick receiving tube 100 is molded with the battery receiving portion 105 which is design to receive the battery 24 in the same manner as the receptacles described above. The dipstick receiving tube 100 includes an internal opening that guides the dipstick 98 into the oil sump such that the level of oil in the oil sump can be determined.

The battery receiving portion 105 includes a release button 104 that allows the operator to release the electric starter battery 24 for removal as desired. In the embodiment shown in FIG. 14, the lower end 102 of the dipstick receiving tube 100 could include an oil level sensor that would be positioned to sense the oil level in the oil sump. The oil level sensor would operate to relay information to the controller contained within the electric starter battery related to the sensed level of oil. The controller in the starter battery could then relay the sensed oil level to a wireless device, such as a smartphone, which can provide real time alerts to the operator when the oil level falls below a minimum level. The receptacle 96 includes a strap 106 surrounding the starter motor 10 to help hold the receptacle 96 on the engine and starter motor 10.

Figure 15:
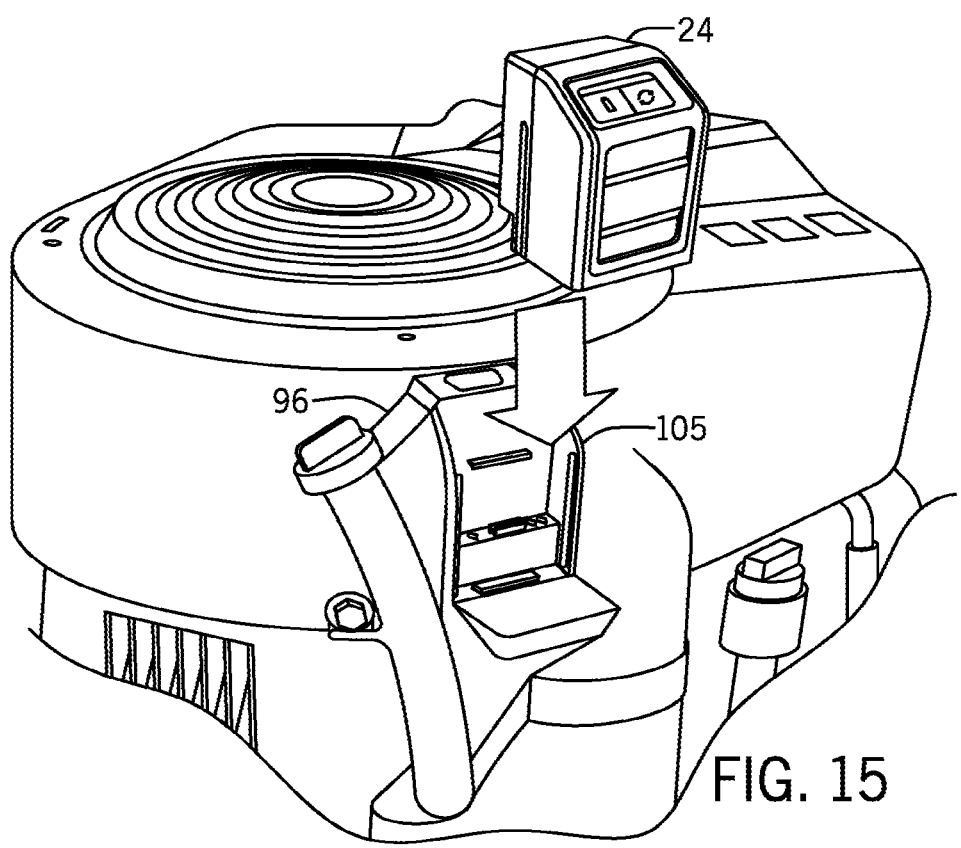
FIG. 15 shows the removal of the electric starter battery from the housing of FIG. 14 according to some embodiments.

FIG. 15 illustrates the electric starter battery 24 being removed from the battery receiving portion 105 of the receptacle 96. As can be seen in FIG. 15, the receptacle 96 includes the various high current contactors and low current pins that engage with the battery pin layout discussed previously. Since the electric starter battery 24 can be easily removed and inserted into the receptacle 96, the entire battery 24 could function as a "key" to enable operation of the lawn tractor/mower. In such an embodiment, when the battery 24 is inserted into the receptacle 96, the insertion would "enable" operation of a push button starting device or ignition key switch, depending on the configuration of the outdoor power equipment. If the battery 24 is not present within the receptacle 96, the engine cannot start and would thus be disabled. In this manner, the battery 24 would function as a key for the tractor/mower. The size and shape of the battery 24 could be modified in such an embodiment to make removal easier and more desirable.

Figure 16:
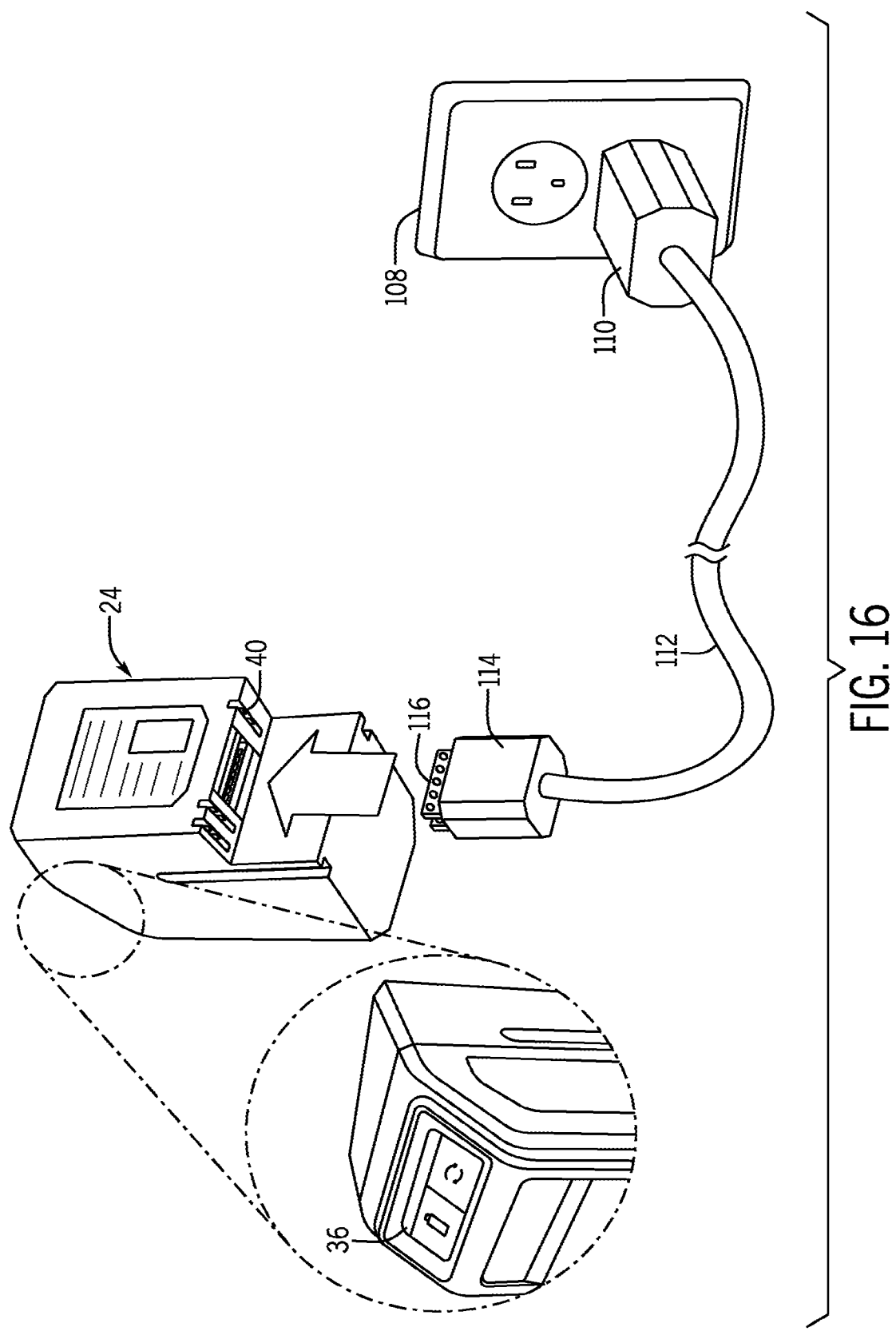
FIG. 16 illustrates one method of charging the electric starter battery according to some embodiments.

FIG. 16 illustrates one contemplated method of charging the electric starter battery 24. As described previously, during normal operation of the outdoor power equipment, the alternator on the equipment would charge the starter battery 24. However, if the starter battery charge becomes depleted for whatever reason, it may be necessary to recharge the battery at a location removed from the equipment. In this embodiment, a wall mounted outlet 108 receives the charging plug 110 which is connected by cord 112 to the low voltage interface plug 114. The low voltage interface plug 114 includes a series of aligned contacts 116 that are received within the series of low current contact pins formed within the interface surface 40. Display 36 allows the user to determine the charge status when the battery 24 is being charged in the manner shown in FIG. 16.

Figure 17:
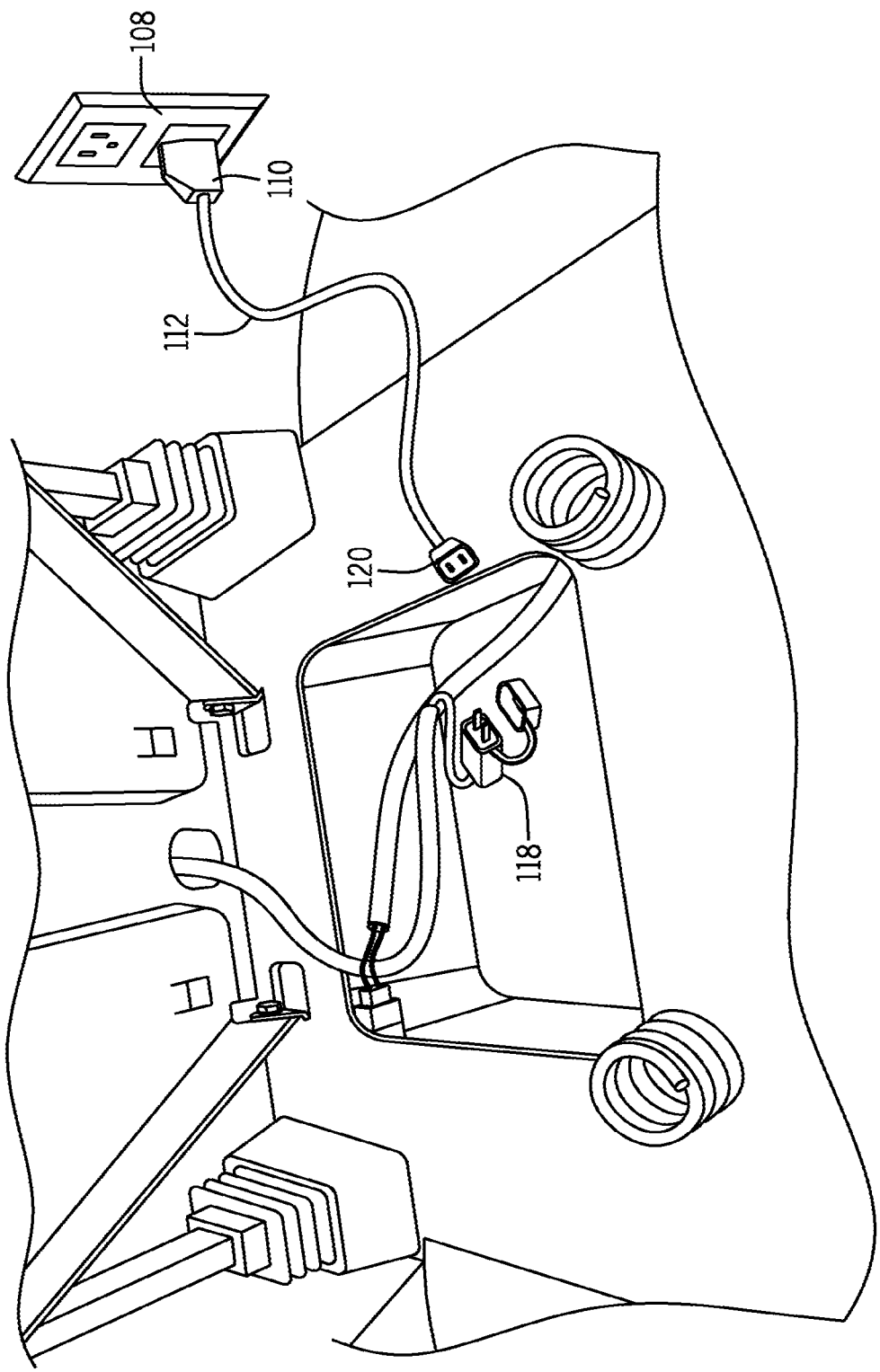
FIG. 17 illustrates a method of charging the electric starter battery without removal from the ZTR mower according to some embodiments.

FIG. 17 illustrates yet another way to charge the electric storage battery from an external power source while the battery is still mounted on the mower. In the embodiment shown in FIG. 17, a charging plug 118 can be uncovered and connected to the wall outlet through a similar cord 112 and plug 110. In the embodiment shown in FIG. 17, a female receptacle 120 receives the plug 118. The embodiment shown in FIG. 17 would allow the electric storage battery 24 to be recharged when the electric storage battery remains mounted on the mower. Such situation may be required if the electric starter battery is used to operate auxiliary equipment on the mower without starting the mower, which would result in complete discharge of the electric starter battery.

Figure 18:
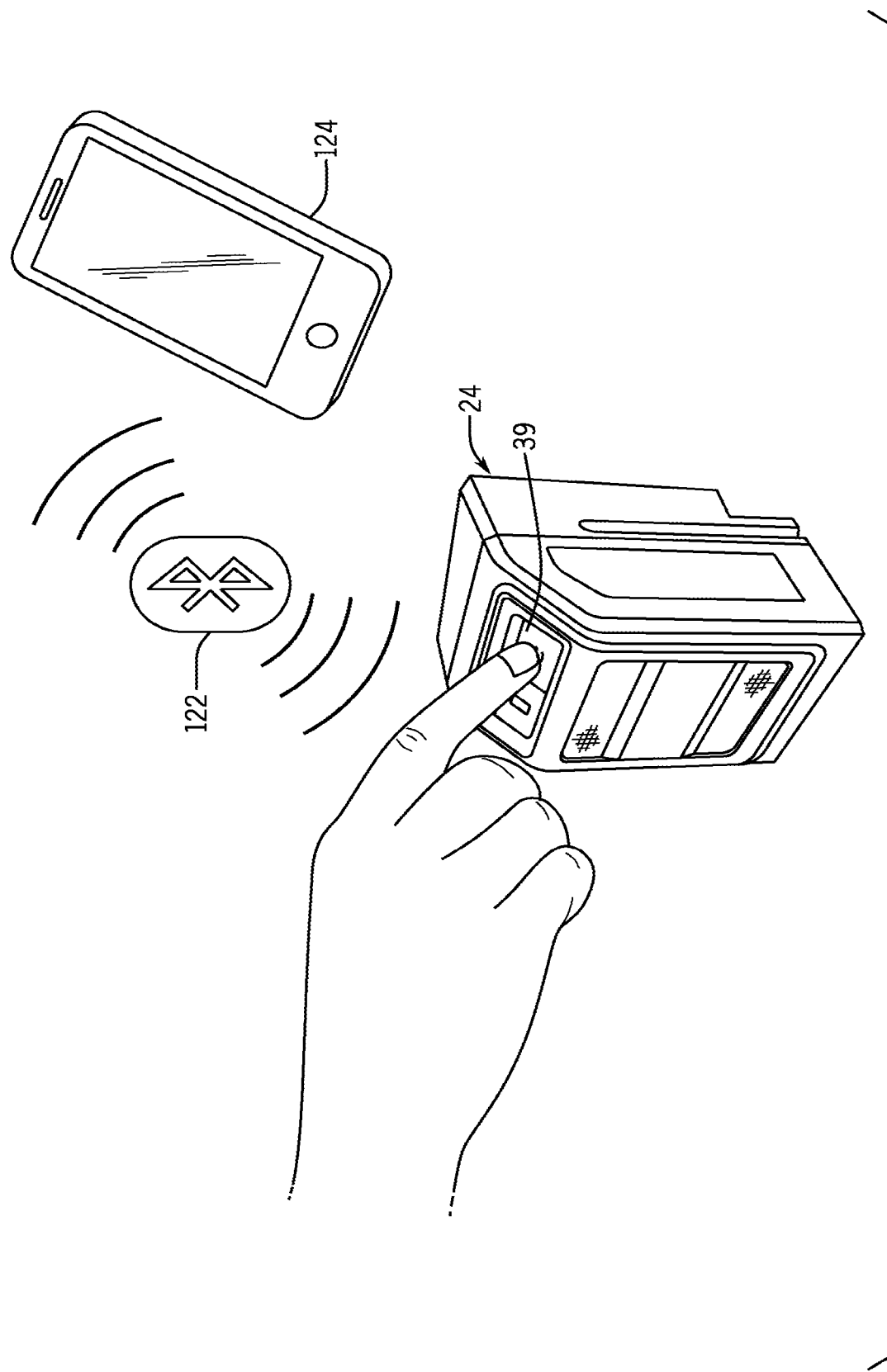
FIG. 18 illustrates the wireless communication between the electric starter battery and a wireless communication device according to some embodiments.

FIG. 18 illustrates additional enhancements made possible utilizing the electric starter battery 24 of the present disclosure. In the embodiment shown in FIG. 18, the circuit board 32 (FIG. 6) contained within the outer housing is designed to include the battery controller and a wireless communication transceiver. The wireless transceiver can transmit wireless signals from the battery controller utilizing known wireless communication techniques, such as Bluetooth 122. When a user depresses the sync button 39, the wireless transceiver sends out a Bluetooth signal that can be received by an external wireless device 124, such as a smartphone. Once the battery controller of the starter battery 24 and the wireless device 124 have been synched together in a well known manner, communication can occur between the two devices. Since the wireless device 124 can communicate using telephone data channels, the information received at the wireless device 124 can be shared to remote locations for monitoring. As an example, information from the tractor/mower could be streamed in real time from the battery 24 to the wireless device 124 and then to a remote location that can include monitoring software. This software could be at the manufacturer or at the users for performance monitoring. Such performance monitoring would be able to predict problems with the mower operation or alert the user when some monitored parameter is out of a desired operating range. The operator can also download computer application software directly onto the wireless device 124 to receive information from the starter battery 24 and monitor mower/tractor performance in real time. The wireless communication between the starter battery 24 and the wireless device 124 would open a wide variety of possible communication applications.

Figure 19:
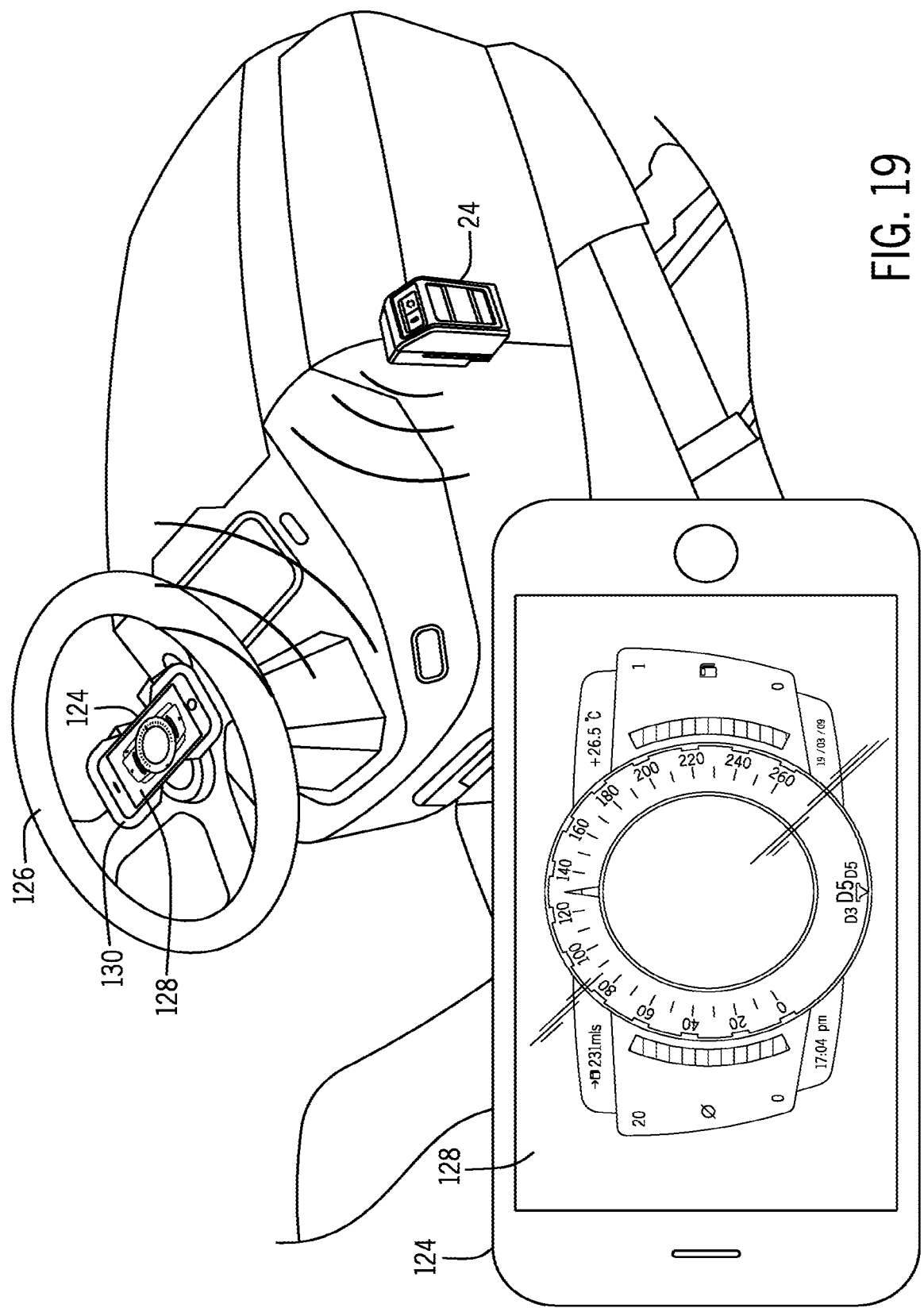
FIG. 19 illustrates the position of the wireless device within the steering wheel of a lawn tractor according to some embodiments.

The communication between the wireless device 124 and the battery controller of the starter battery 24 could be continuous during operation of the outdoor power equipment, which would allow the user to monitor operating parameters and conditions. As shown in FIG. 19, in one embodiment of the present disclosure, the wireless device 124 can be mounted within the center of the steering wheel 126 to provide a dashboard display 128 for the user. The dashboard display 128 can be configured as desired by the application software on the wireless device and can display a wide variety of tractor/mower related information to the operator of the tractor/mower. This information can include current engine speed, oil temperature, a fuel gauge, oil pressure, number of hours used, as well as other information that may be interesting or useful for the operator. By using the wireless device 124 as the dashboard display, the cost of a dedicated display for the tractor can be eliminated. Further, the application software on the wireless device can be updated by the user and the manufacturer to add additional feature and functions.

In the embodiment shown in FIG. 19, a pair of gripping brackets 130 is mounted to the steering wheel to securely hold the wireless device 124 in position on the steering wheel 126. The gripping brackets 130 can be formed from a flexible, resilient material that protects the wireless device 124. The gripping brackets 130 can be adjusted on the steering wheel to accommodate wireless devices 124 having different sizes and from different manufacturers. The wireless device 124 is positioned close enough to the electric starter battery 24 such that the electric starter battery 24 can relay and receive wireless signals from the wireless device 124.

Figure 20:
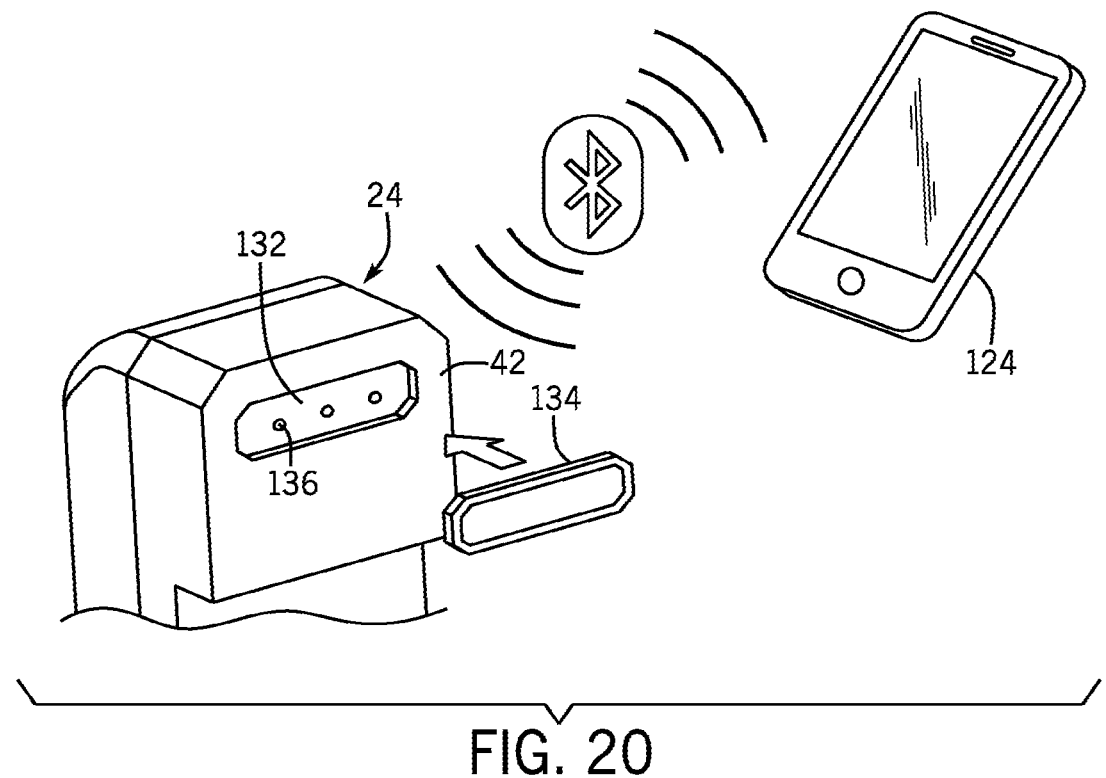
FIG. 20 illustrates an alternate method of wireless communication between the electric starter battery and the wireless device according to some embodiments.

FIG. 20 illustrates an alternate embodiment of the starter battery 24 in which the back face 42 of the starter battery 24 includes a receiving slot 132 that can receive a communication dongle 134. The dongle 134 interfaces with contacts 136 to communicate with the battery controller mounted to the circuit board contained within the starter battery pack. The dongle 134 includes a wireless transceiver and thus can be used to add wireless communication to the battery 24 if a user/operator wishes to upgrade at a date after purchase. By removing the wireless transceiver from within the starter battery 24, the initial purchase cost of the starter battery 24 can be reduced for some users while allowing the user to add the communication feature if desired in the future.

Figure 21:
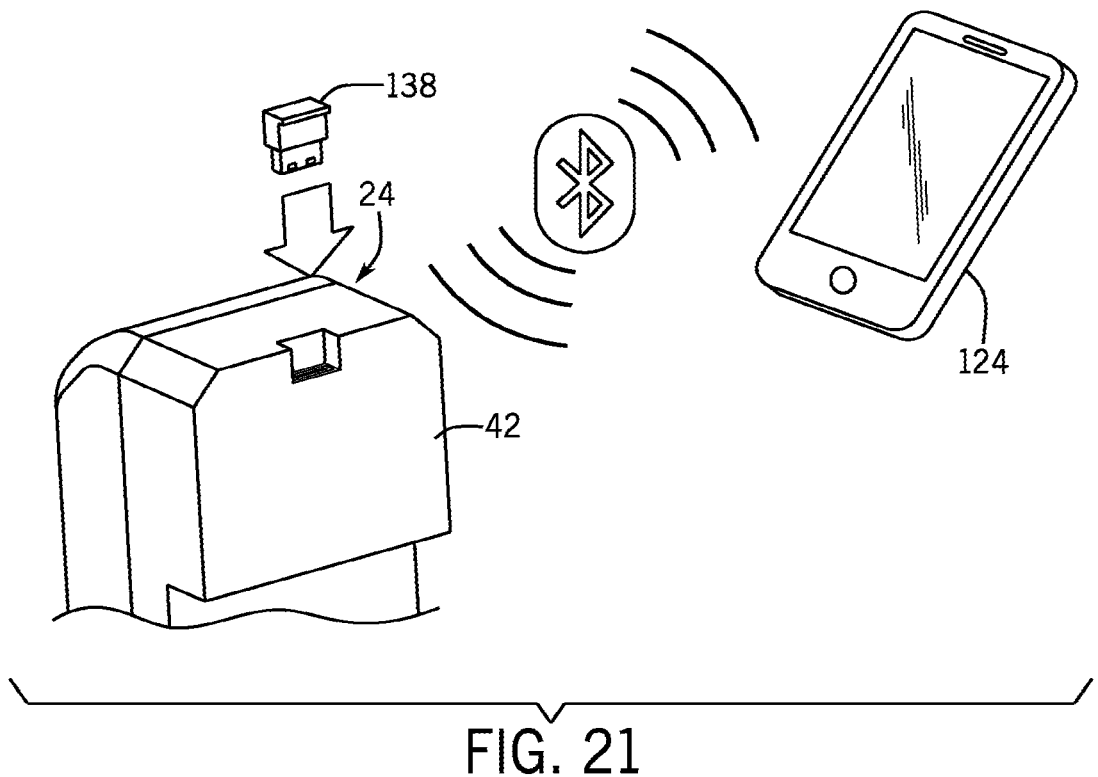
FIG. 21 illustrates yet another alternate method of communication between the electric starter battery and the wireless device according to some embodiments.

FIG. 21 illustrates another type of dongle 138 to permit wireless communication with the wireless device 124. Again, the dongle 138 includes the wireless transceiver that communicates with the battery controller mounted on the circuit board contained within the starter battery 24 and can be added by a user/owner at a later date should wireless communication become desirable.

Figure 22:
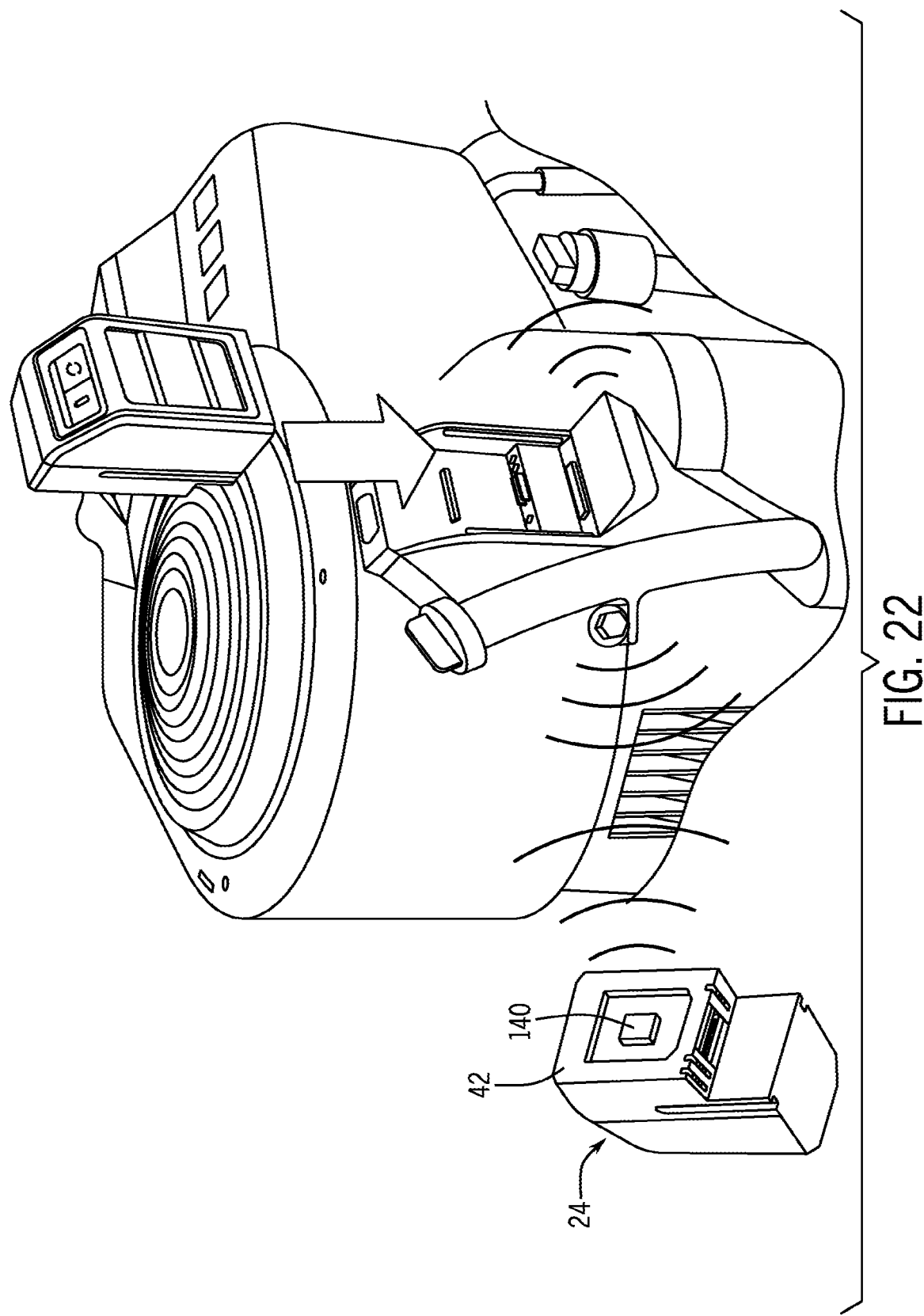
FIG. 22 illustrates the use of RFID/NFC detection technology with the electric starter battery according to some embodiments.

FIG. 22 illustrates an RFID/NFC chip 140 added to the internal circuit board within the battery 24. The RFID/NFC chip 140 is positioned behind the back face 42 of the outer housing of the battery 24. The RFID/NFC chip can be used to identify the type of engine/equipment being used and powered by the electric starter battery. In this manner, the controller of the electric starter battery can configure operation of the battery and various other applications based upon the type of engine being started. As an example, a snow-thrower engine may have different cranking requirements and timing for the starter motor due to the cold weather operation environment as compared to a ZTR mower. If the controller of the battery 24 can identify the type of engine and application, the controller can modify the operation of the battery pack to optimize performance.

Figure 23:
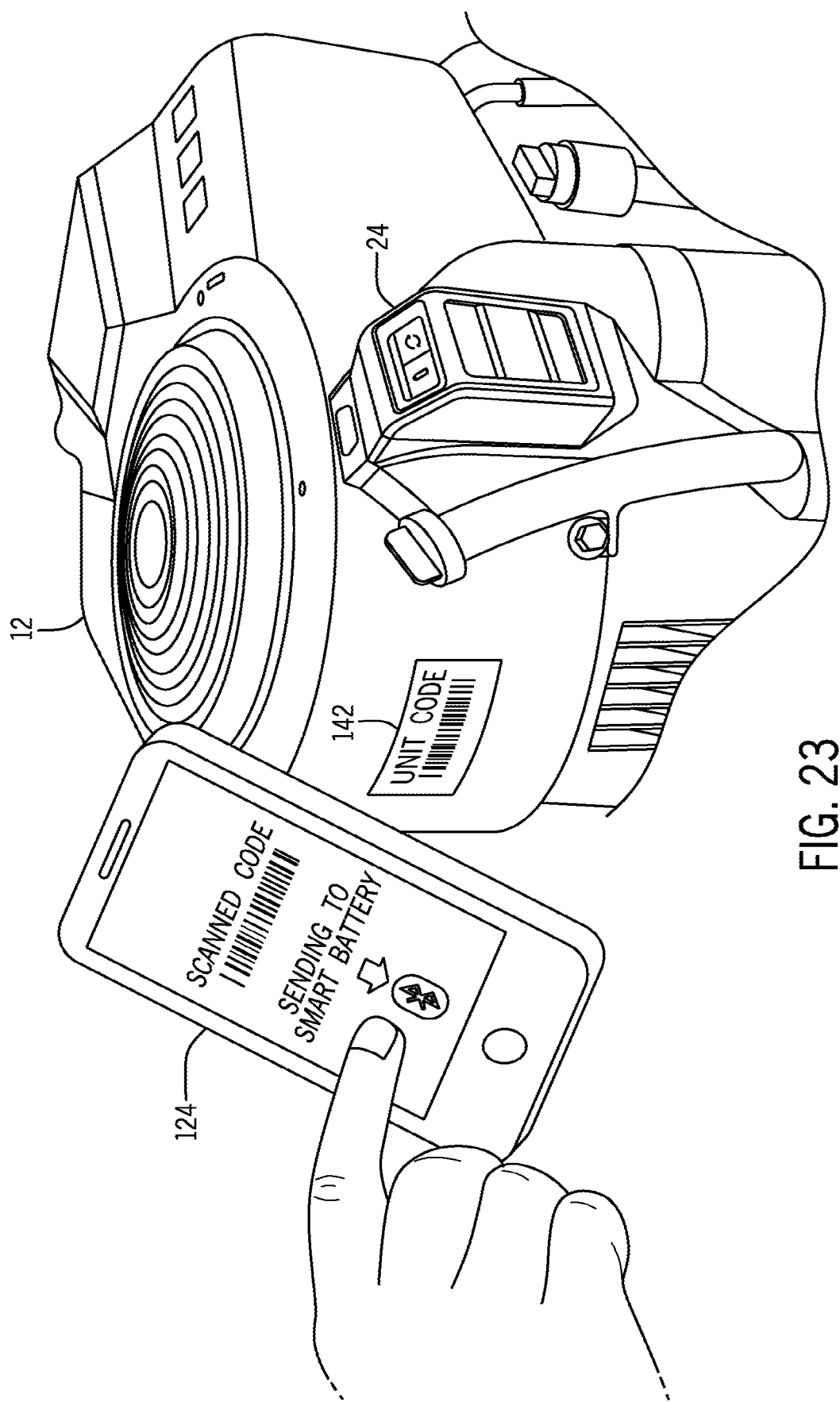
FIG. 23 illustrates the identification of an engine by a wireless device and communication to the electric starter battery according to some embodiments.

FIG. 23 illustrates the use of the wireless device 124 to scan a unique code 142 applied to the engine 12. Through this code 142, the wireless device 124 can identify the type of engine and application and relay this information to the battery controller of the starter battery 24. Upon receiving this information, the starter battery 24 can configure its operation since different features may be required depending upon the type of application.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A battery pack configured to be coupled to outdoor power equipment, the battery pack comprising:
   a plurality of cells;
   a pin configured to electrically couple the battery pack to the outdoor power equipment;
   a battery controller configured to receive equipment operation information from the outdoor power equipment via the pin; and
   a wireless transceiver configured to wirelessly transmit signals from the battery controller to a device, wherein the battery controller is configured to instruct the wireless transceiver to transmit the equipment operation information to the device.

2. The battery pack of claim 1, wherein the pin is a first pin configured to supply power to an electric motor of the outdoor power equipment.

3. The battery pack of claim 2, further comprising a second pin configured to supply power to auxiliary electrical components of the outdoor power equipment.

4. The battery pack of claim 3, further comprising an enable pin configured to receive a signal from a key switch of the outdoor power equipment, wherein the battery controller is configured to determine, based on the signal, that the key switch is in an auxiliary position and to supply power to the auxiliary electrical components via the second pin.

5. The battery pack claim 3, further comprising a dedicated low current charging pin configured to supply power from the outdoor power equipment to the plurality of cells.

6. The battery pack of claim 2, further comprising a second pin configured to receive a signal from a key switch of the outdoor power equipment, wherein the battery controller is configured to determine, based on the signal, that the key switch is in a starting position and to supply power to the electric motor via the first pin.

7. The battery pack of claim 2, further comprising a push-to-start pin configured to receive a signal from a push-to-start pin button of the outdoor power equipment, wherein, upon receipt of the signal, the battery controller is configured to supply power to the electric motor via the first pin.

8. The battery pack of claim 1, further comprising an identification pin configured to provide information regarding the battery pack to the outdoor power equipment.

9. Outdoor power equipment comprising:
   a chassis;
   an electric motor;
   a battery pack coupled to the chassis and configured to power the electric motor; and
   a mounting bracket coupled to the chassis and configured to mount a smart device;
   wherein the battery pack is configured to wirelessly communicate with the smart device to supply information relating to the operation of the outdoor power equipment to the smart device.

10. The outdoor power equipment of claim 9, further comprising a steering wheel configured to steer the outdoor power equipment, wherein the mounting bracket is positioned on the steering wheel.

11. The outdoor power equipment of claim 9, wherein the information comprises a number of hours the outdoor power equipment has been in operation.

12. The outdoor power equipment of claim 9, wherein the battery pack is configured to communicate with the smart device via Bluetooth.

13. The outdoor power equipment of claim 9, wherein the battery pack is configured to receive a removable dongle, the removable dongle enabling communication between the battery pack and the smart device.

14. The outdoor power equipment of claim 9, wherein the battery pack includes a battery controller configured to detect a type of outdoor power equipment to which the battery pack is coupled, and wherein the battery controller is configured to modify operation of the battery pack based on the type of outdoor power equipment.

15. The outdoor power equipment of claim 9, wherein the battery pack includes a battery controller configured to receive a signal from the smart device identifying a type of outdoor power equipment to which the battery pack is coupled, wherein the battery pack is configured to adjust its operation based on the type of outdoor power equipment identified.

16. The outdoor power equipment of claim 9, wherein the battery pack includes a first pin configured to supply power to the electric motor.

17. The outdoor power equipment of claim 16, wherein the battery pack includes a second pin configured to supply power to auxiliary electrical components of the outdoor power equipment.

18. The outdoor power equipment of claim 17, wherein the battery pack includes an enable pin configured to receive a signal from a key switch of the outdoor power equipment, wherein a battery controller is configured to determine, based on the signal, that the key switch is in an auxiliary position and to supply power to the auxiliary electrical components via the second pin.

19. Outdoor power equipment comprising:
  a chassis;
  an electric motor;
  a battery pack configured to supply power to the electric motor, the battery pack including:
    an electrical pin or a RFID/NFC chip; and
    a battery controller configured to receive information regarding the outdoor power equipment via the electrical pin or the RFID/NFC chip; and
  a wireless transceiver configured to wirelessly transmit signals from the battery controller to a remote device, wherein the battery controller is configured to instruct the wireless transceiver to transmit at least a portion of the information to the remote device.

20. The outdoor power equipment of claim 19, wherein the information identifies a type of the outdoor power equipment, wherein the battery controller is configured to control operation of the battery pack based on the type of the outdoor power equipment.

* * * * *